(12) United States Patent
Takano et al.

(10) Patent No.: US 12,525,975 B2
(45) Date of Patent: Jan. 13, 2026

(54) SEMICONDUCTOR INTEGRATED CIRCUIT DEVICE

(71) Applicants: Yoichi Takano, Hadano (JP); Kohei Sakurai, Atsugi (JP)

(72) Inventors: Yoichi Takano, Hadano (JP); Kohei Sakurai, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 81 days.

(21) Appl. No.: 18/495,945

(22) Filed: Oct. 27, 2023

(65) Prior Publication Data

US 2024/0146300 A1 May 2, 2024

(30) Foreign Application Priority Data

Oct. 31, 2022 (JP) ................................. 2022-174014

(51) Int. Cl.
*H03K 17/00* (2006.01)
*H03K 17/687* (2006.01)
*H03K 19/20* (2006.01)

(52) U.S. Cl.
CPC ......... *H03K 17/6871* (2013.01); *H03K 19/20* (2013.01); *H03K 2217/0054* (2013.01)

(58) Field of Classification Search
CPC ....... H03K 2217/0054; H03K 17/6871; H03K 17/16; G05F 1/573; G05F 1/575; G05F 1/465; G05F 1/565
See application file for complete search history.

(56) References Cited

U.S. PATENT DOCUMENTS

| | | | | |
|---|---|---|---|---|
| 5,453,025 A | * | 9/1995 | Wilson | H01R 13/41 439/578 |
| 5,543,733 A | * | 8/1996 | Mattos | H03K 19/00315 326/68 |
| 6,043,680 A | * | 3/2000 | Dasgupta | H03K 19/00315 326/86 |
| 6,184,700 B1 | * | 2/2001 | Morris | H03K 19/00315 326/14 |
| 2006/0214651 A1 | * | 9/2006 | Ke | G05F 1/575 323/311 |
| 2009/0128108 A1 | * | 5/2009 | Yamashita | G05F 1/56 323/281 |

FOREIGN PATENT DOCUMENTS

JP 2022-138849 A 9/2022

* cited by examiner

*Primary Examiner* — Tuan T Lam
(74) *Attorney, Agent, or Firm* — Shih IP Law Group, PLLC.

(57) ABSTRACT

Disclosed is a semiconductor integrated circuit device including: a switching transistor connected between a voltage input terminal where DC voltage is input and a voltage output terminal; a discharging transistor connected between the voltage output terminal and a ground point; an external terminal where a control signal of an external device is input; and a control circuit including a logic circuit and controlling and turning on or off the switching transistor and the discharging transistor based on the control signal. Upon the control signal input to the external terminal being at a first logic level, the logic circuit generates a signal that turns on the switching transistor and turns off the discharging transistor. Upon the control signal being at a second logic level, the logic circuit generates a signal that turns off the switching transistor and turns on the discharging transistor.

4 Claims, 6 Drawing Sheets

SEMICONDUCTOR INTEGRATED CIRCUIT DEVICE

REFERENCE TO RELATED APPLICATIONS

This application is based upon and claims the benefit of priority from the prior Japanese Patent Application No. 2022-174014, filed on Oct. 31, 2022, the entire contents of which are incorporated herein by reference.

TECHNICAL FIELD

The present invention relates to a semiconductor integrated circuit device (IC) that includes a switching transistor connected between a voltage input terminal and an output terminal, a discharging transistor at the output terminal, and a logic circuit that turns on and off these transistors. The present invention relates to, for example, a technique which is effectively used for use in a load switch IC.

DESCRIPTION OF RELATED ART

A load switch IC is an element (device) that is connected in series between a power supply and a load to supply and cut off the power supply voltage to the load.

As illustrated in FIG. 6, the load switch IC is provided on a power supply line 12 that supplies power supply voltage from a power supply 10 to a load 11. The load switch IC is used to supply and interrupt power according to commands from a microcomputer 13, to intermittently operate a device or a system that serves as a load, and to switch to backup power supply.

A conventional load switch IC does not have a discharge circuit that releases electric charge from the output terminal OUT. Therefore, it takes time for the power supply output to the load to drop after the load switch is turned off. As a result, when the load switch is turned on and the load device or the system is restarted before the voltage at the output terminal OUT drops to around 0 V, problems such as malfunction or destruction of the element that constitutes the load device could occur.

In order to avoid the above problems, a discharge circuit that releases electric charge from the output terminal immediately after the load switch is turned off can be provided. On the other hand, a load switch IC can be used in a system provided with a backup power supply and a backup switch as illustrated in FIG. 1. In such a case, when a discharge circuit is simply provided at the output terminal of the load switch IC, current from the backup power supply flows through the discharge circuit to the ground point upon switching to the backup power supply. Furthermore, when the load switch is configured with an insulated gate field effect transistor (MOSFET), there is the problem of reverse current flow in response to the output terminal voltage being higher than the input terminal voltage upon switching to the backup power supply.

As an invention of an IC having a load switch, a power supply control device (IC) is disclosed in JP 2022-138849A. The IC according to the invention described in JP 2022-138849A has a power good circuit that outputs a power good signal that becomes active when the output voltage exceeds a set voltage and becomes inactive when the output voltage drops below the set voltage. The on/off state of the load switch is then controlled by the power good signal so that the state of the output path is switched between conduction and interruption.

JP2022-138849A does not disclose a process of providing a discharge circuit to release electric charge from the output terminal, nor does it disclose the above problems due to the absence or presence of the discharge circuit.

SUMMARY OF THE INVENTION

The present invention has been made in view of the above-described problems, and an object of the present invention is to provide a load switch IC capable of rapidly lowering the power supplied to the load when the load switch is turned off to interrupt the power supplied to the load.

Another object of the present invention is to provide a load switch IC capable of preventing the current from the backup power supply from flowing through the discharge circuit to a ground point upon switching to the backup power supply when used in a system including a main power supply and a backup power supply.

Still another object of the present invention is to provide a load switch IC capable of preventing the reverse current flowing to the element of the load switch upon disconnection of the main power supply and switching to the backup power supply when used in a system having a main power supply and a backup power supply.

In order to achieve at least one of the abovementioned objects, according to an aspect of the present disclosure, there is provided a semiconductor integrated circuit device including:
- a switching transistor that is connected between a voltage input terminal to which DC voltage is input and a voltage output terminal;
- a discharging transistor that is connected between the voltage output terminal and a ground point;
- an external terminal to which a control signal of an external device is input; and
- a control circuit that controls and turns on or off the switching transistor and the discharging transistor based on the control signal, wherein
- the control circuit includes a logic circuit,
- upon the control signal that is input to the external terminal being at a first logic level, the logic circuit generates a signal that controls the switching transistor to be turned on and controls the discharging transistor to be turned off, and
- upon the control signal that is input to the external terminal being at a second logic level, the logic circuit generates a signal that controls the switching transistor to be turned off and controls the discharging transistor to be turned on.

According to the semiconductor integrated circuit device having the above configuration, when the control signal input from an external control device such as a microcontroller to an external terminal (CE terminal) is set to the second logic level, the switching transistor (load switch) is controlled to be turned off and the discharging transistor is controlled to be turned on. Therefore, when the load switch is turned off and the power supply to the load is interrupted, the discharging transistor is turned on and the electric charge at the output terminal is released, allowing the power supply to the load to drop rapidly.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION

Hereinafter, one or more embodiments of the present invention will be described with reference to the drawings. However, the scope of the present invention is not limited to the disclosed embodiments.

Figure 1:
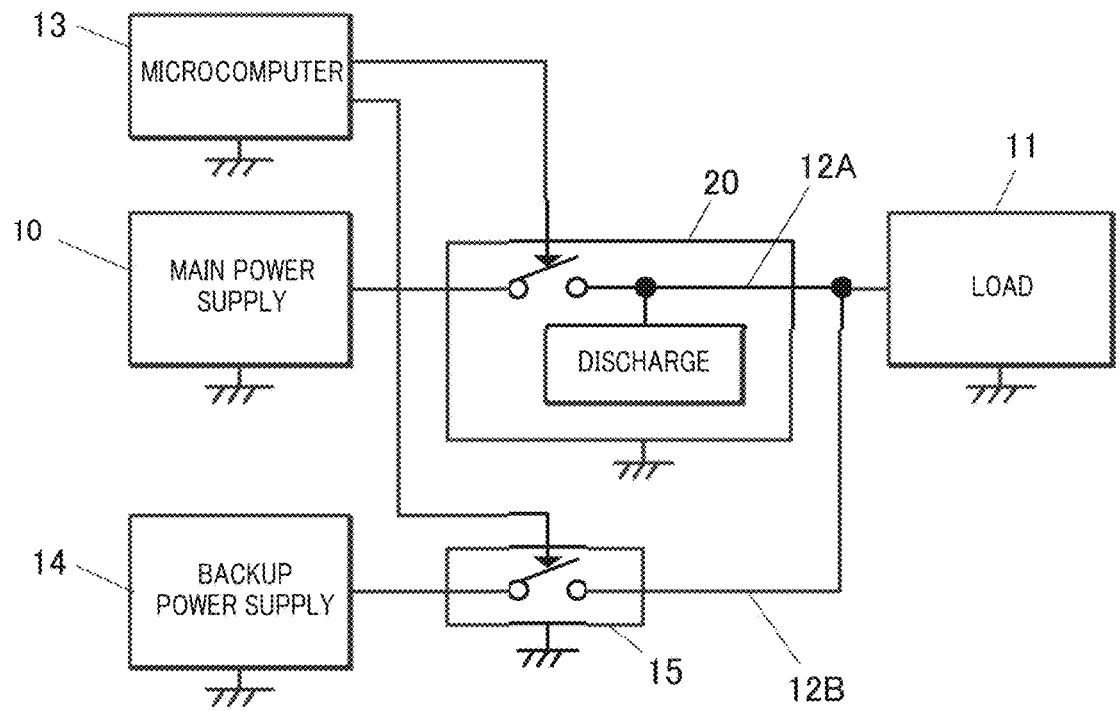
FIG. 1 is a circuit configuration diagram illustrating an example of a system using a load switch IC to which the present invention is applied.

FIG. 1 illustrates an example of a system to which a load switch IC of the present invention is applied.

The system illustrated in FIG. 1 includes a main power supply 10 and a backup power supply 14 and is provided with a load switch IC 20 on the power supply line 12A that supplies power supply voltage from the main power supply 10 to the load 11. The system illustrated in FIG. 1 is also provided with a backup switch 15 on a power supply line 12B that supplies power supply voltage from the backup power supply 14 to the load 11. The on/off states of the load switch IC 20 and the backup switch 15 are controlled in accordance with commands from the microcontroller 13, such that the electric power to the load 11 is supplied and interrupted and such that a switchover to the backup power supply 14 is made. The main power supply 10 may be configured with a power supply control IC including a battery and a voltage regulator, an AC-DC converter, or the like.

Figure 2:
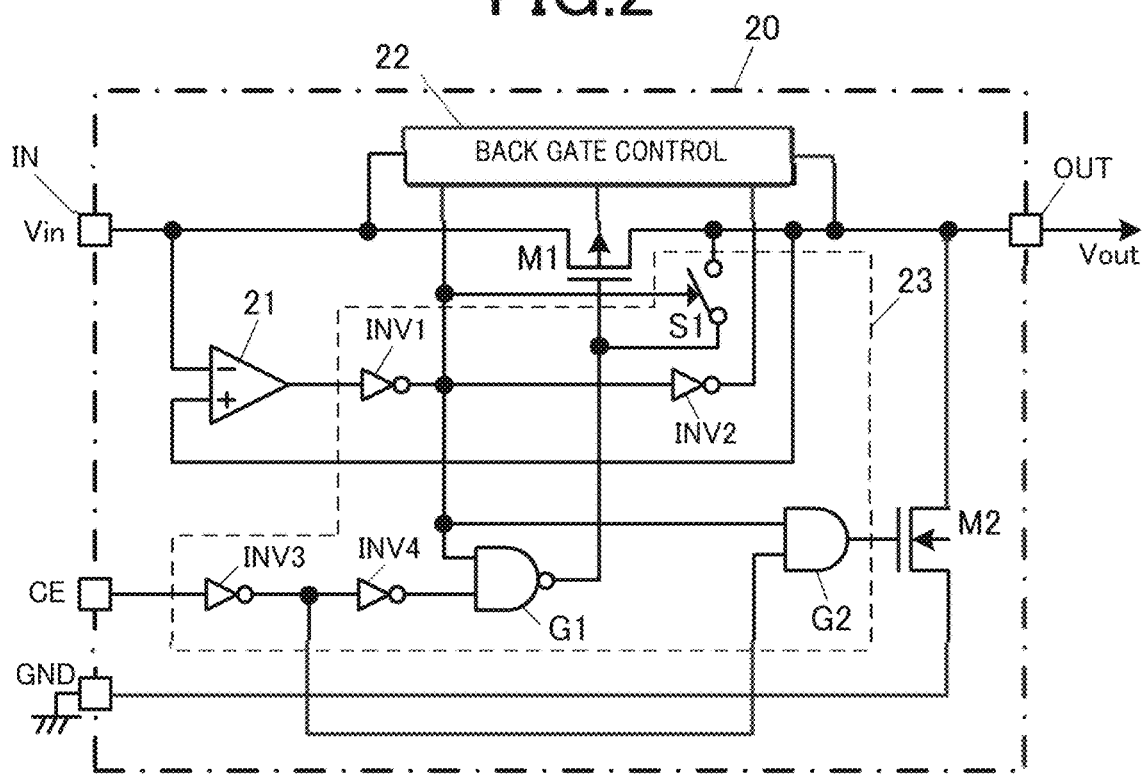
FIG. 2 is a circuit configuration diagram illustrating an embodiment of a load switch IC according to the present invention.

FIG. 2 illustrates an embodiment of the load switch IC 20 according to the present invention. In FIG. 2, the portion surrounded by a dash-dotted line is formed as a semiconductor integrated circuit (IC) on a semiconductor chip such as monocrystalline silicon.

In the load switch IC 20 of the present embodiment, as illustrated in FIG. 2, a transistor M1 as a load switch, which is a P-channel type MOS transistor, is connected between a voltage input terminal IN to which a DC input voltage Vin is applied and an output terminal OUT to which a load is connected. A discharging transistor M2, which is an N-channel type MOS transistor, is connected between the output terminal OUT and a ground point. A switch S1 is connected between the gate of the transistor M1 and the output terminal OUT.

The IC 20 further includes a comparator (voltage comparison circuit) 21 that detects comparison result of the voltage Vin at the input terminal IN and the voltage Vout at the output terminal OUT, and a back gate control circuit 22 that prevents reverse current in the load switching transistor M1. The IC 20 includes an external terminal CE for chip control to which signals from an external microcontroller (CPU) or the like are input, and a logic circuit 23 to which the electric potential of the external terminal CE and the output of the above comparator 21 are input. The logic circuit 23 is configured with a logic gate circuit including an inverter and a NAND gate, and controls the load switching transistor M1 and the discharging transistor M2 to be turned on and off. Therefore, the comparator 21, the back gate control circuit 22, and the logic circuit 23 function as the control circuit that controls the inside of the IC 20.

The above logic circuit 23 includes inverters INV1 and INV2 that invert the output of the above comparator 21, inverters INV3 and INV4 that invert the electric potential of the external terminal CE, a NAND gate G1 to which the outputs of the inverters INV1 and INV4 are input, and an AND gate G2 to which the outputs of the inverters INV1 and INV3 are input.

The switch S1 is controlled to be turned on and off based on the output of the above inverter INV1. The load switching transistor M1 is controlled to be turned on and off based on the output of the NAND gate G1. The discharging transistor M2 is controlled to be turned on and off based on the output of the AND gate G2.

The load switching transistor M1 is controlled to be turned on and off depending on the voltage at the gate terminal that is switched to high or low electric potential depending on the output of the NAND gate G1. Specifically, the load switching transistor M1 is turned on when the output of the NAND gate G1 is a low level and is turned off when the output of the NAND gate G1 is a high level. The output of the NAND gate G1 is set to the high or low level depending on the output of the comparator 21 and the high or low state of the control terminal CE.

The following TABLE 1 is a truth table that represents the input to and output of the logic circuit 23.

TABLE 1

|  | CE | OUTPUT FROM COMPARATOR | LOAD SWITCHING TRANSISTOR | DISCHARGING TRANSISTOR |
|---|---|---|---|---|
| NORMAL STATE | H | L | ON | OFF |
| (Vin ≥ Vout) | L | L | OFF | ON |
| REVERSED STATE | H | H | OFF | OFF |
| (Vin < Vout) | L | H | OFF | OFF |

According to TABLE 1, in the load switch IC of the present embodiment, in a normal state (Vin≥Vout) in which the input voltage Vin is equal to or higher than the output voltage Vout, the load switching transistor M1 is turned on and the discharging transistor M2 is turned off when the control terminal CE is set to a high state "H".

Alternatively, in the normal state (Vin≥Vout), when the control terminal CE is set to a low state "L", the load switching transistor M1 is turned off, the discharging transistor M2 is turned on, and the electric charge is released from the output terminal. As a result, the output voltage Vout of the load switch IC of the present embodiment drops rapidly when the load switching transistor M1 is turned off, and the load can be restarted or operated intermittently without any problem.

On the other hand, in a reversed state (Vin<Vout), in which the input voltage Vin is lower than the output voltage Vout, whether the control terminal CE is in the high state "H" or in the low state "L", both the load switching transistor M1 and the discharging transistor M2 are controlled to be turned off. Therefore, as a result of a voltage drop in the main power supply 10 or a stoppage of the input voltage Vin due to disconnection of the main power supply 10, the voltage from the backup power supply 14 is supplied to the load in the load switch IC of the present embodiment, which is detected by the comparator 21, and the load switching transistor M1 is turned off.

In the load switch IC of the present embodiment in the reversed state (Vin<Vout), even when the load switching transistor M1 is turned off, the discharging transistor M2 is not turned on but remains to be turned off. Therefore, even when a microcomputer turns on the backup switch 15 to supply backup power to the load, the discharging transistor M2 is turned on and prevents unnecessary current from flowing from the output terminal toward the ground point.

Figure 3:
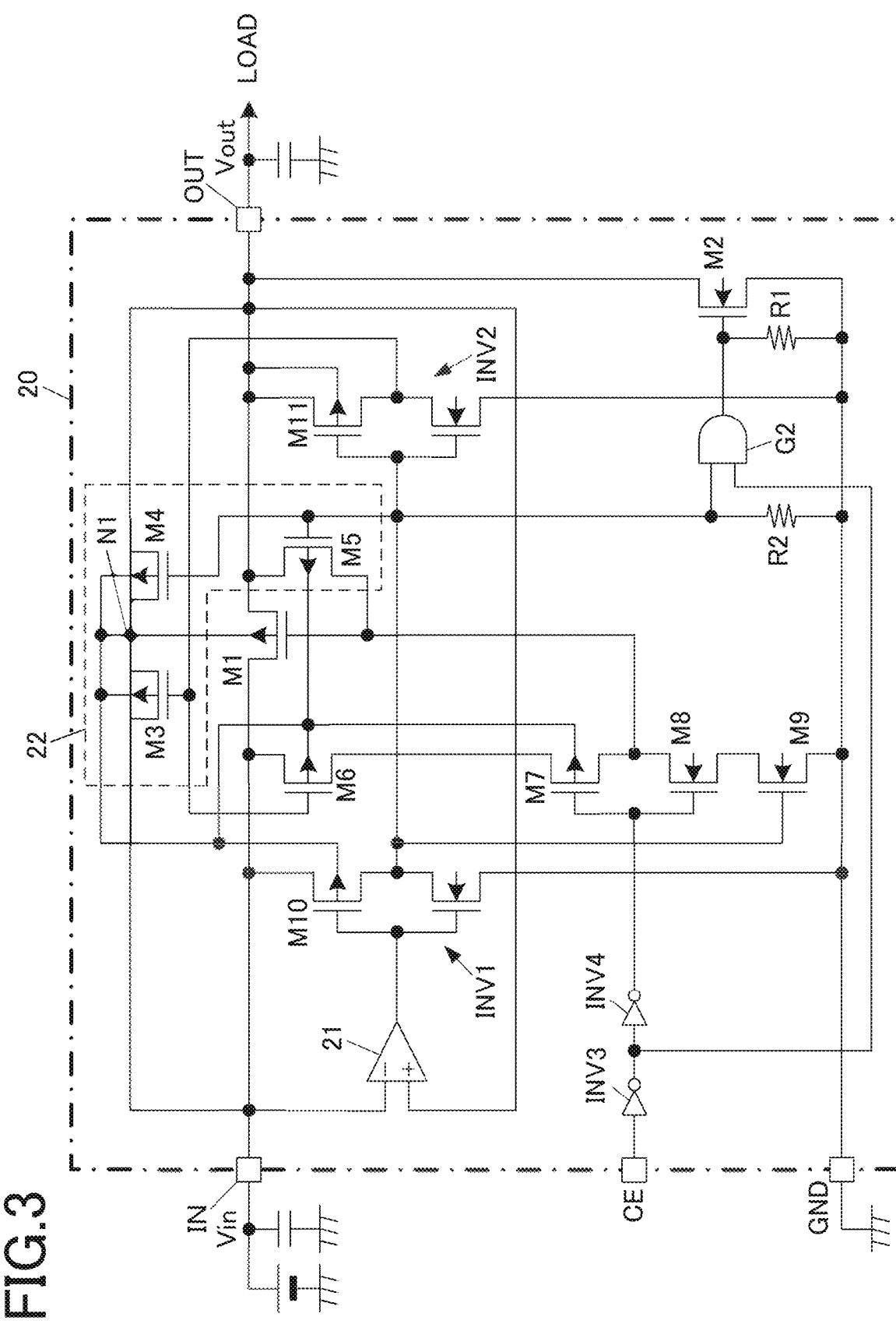
FIG. 3 is a circuit diagram illustrating a specific example of the circuit of the load switch IC illustrated in FIG. 2.

FIG. 3 illustrates a specific example of the circuit in the load switch IC 20 illustrated in FIG. 2. In FIG. 3, the elements and circuits illustrated in FIG. 2 are labeled with the same signs as in FIG. 2 and are not explained again.

In the circuit illustrated in FIG. 3, the back gate control circuit 22 includes P-channel type MOS transistors M3 and M4 that are connected in series between the input terminal IN and the output terminal OUT, and a P-channel type MOS transistor M5 that is connected between the gate of load switching transistor M1 and the output terminal OUT. The transistor M5 corresponds to the switch S1 in FIG. 2.

The back gate of the load switching transistor M1 and the back gates of the transistors M3 and M4 are connected to the connection node N1 between the transistors M3 and M4. The back gate of the transistor M5 is also connected to the connection node N1 between the transistors M3 and M4.

When the input terminal IN is open (there is no input voltage Vin) and the input/output is reversed, the output of the NAND circuit consisting of the transistors M3 to M9 becomes undefined. In this case, the gate voltage of the load switching transistor M1 becomes undefined, and the transistor M1 may be turned on and generate a reverse current. Here, when the transistor M5 is turned on, the gate voltage of the transistor M1 becomes the drain voltage (the voltage of the output terminal OUT), and the transistor M1 is forced to be turned off, such that generation of the reverse current in the transistor M1 is prevented.

In the circuit of the present example, P-channel type MOS transistors M6, M7 and N-channel type MOS transistors M8, M9 connected in series between the input terminal IN and the ground point form an integrated circuit having the same function as the NAND gate G1 and the switch S1 constituting the logic circuit 23 illustrated in FIG. 2. Of these transistors, the transistor M9 functions as a switch that prevents current leakage from the output terminal OUT through the transistors M5 and M8 to the ground point in the reversed state (Vin<Vout).

The back gates of the above P-channel type MOS transistors M6 and M7 constituting the logic circuit 23 and the back gate of the P-channel type MOS transistor M10 constituting the inverter INV1 are connected to the connection node N1 between the above transistors M3 and M4 constituting the back gate control circuit 22.

Here, the inverter INV2 is configured to operate by taking the voltage Vout at the output terminal OUT as the power supply voltage. Therefore, back gate control (switching) is possible because the inverter INV2 operates in response to the voltage supplied from the output terminal OUT even when the input/output is reversed. When the transistor M3 is turned on in the normal state (Vin≥Vout), the electric potential of the node N1 that is the back gate of the P-channel type MOS transistor becomes the input electric potential Vin. On the other hand, when the transistor M4 is turned on in the reversed state (Vin<Vout), the electric potential of the node N1 becomes the output electric potential Vout. Therefore, it is possible to prevent reverse current in the P-channel type MOS transistor, in which an electric potential at a body diode (also called a parasitic diode) between the source (drain) and the back gate is reversed when the input and output directions are switched.

Although not shown in the drawings, the comparator 21, the inverters INV1, INV3 and INV4, and the AND gate G2 are configured to operate by taking the input voltage Vin as the power supply voltage.

Furthermore, in the present embodiment, a first pull-down resistor R1 is provided between the gate terminal of the discharging transistor M2 and the ground point. Also, a second pull-down resistor R2 is provided between the input terminal to which the output of the comparator 21 of the AND gate G2 is input and the ground point. Because of these pull-down resistors R1 and R2, the inputs to the gate terminal of the transistor M2 and to the AND gate G2 do not enter an undefined state but are fixed at a low level even when the input voltage Vin becomes 0 V and the comparator 21 and the AND gate G2 stop operating. As a result, malfunction can be prevented.

Thus, for example, in the system illustrated in FIG. 1, the microcontroller 13 detects the disconnection of the main power supply 10 and turns on the backup switch (15) to supply power from the backup power supply 14 to the load 11. In such cases, the operations of the comparator 21 and the logic circuit 23 are stopped, but the gate terminal of the discharging transistor M2 is fixed at a low level because of the pull-down resistors R1 and R2. As a result, it is possible to prevent unnecessary current from flowing from the backup power supply 14 through the discharging transistor M2 into the load switch IC 20.

Figure 4A:
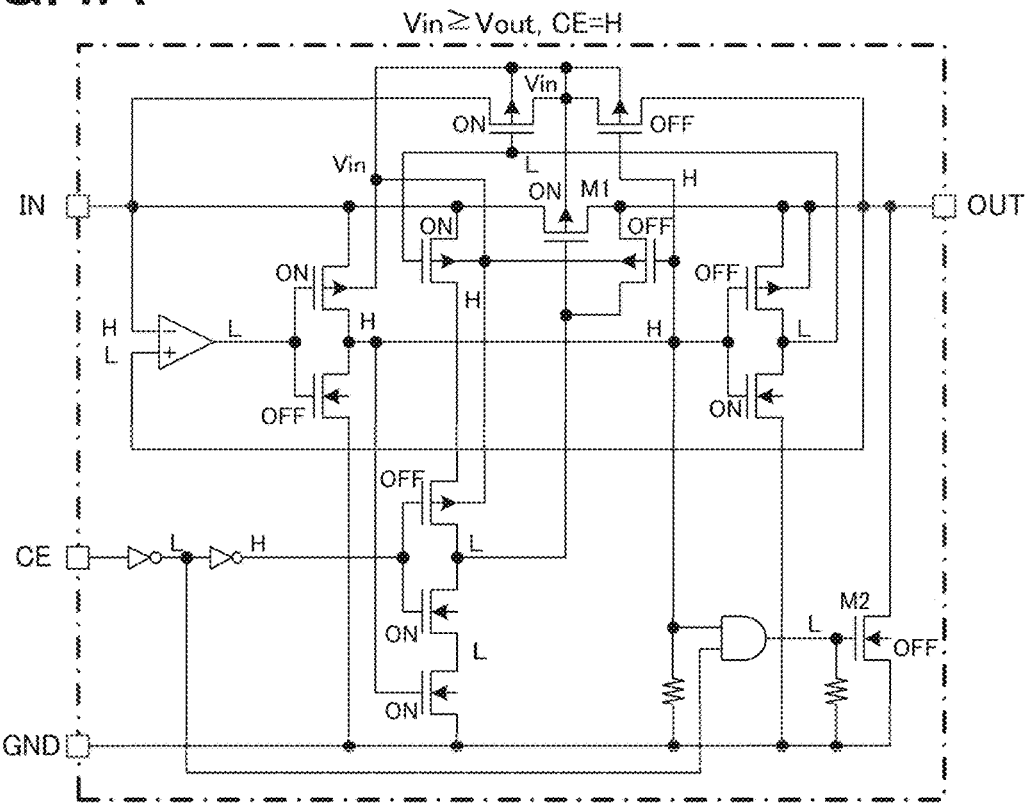
FIG. 4A is a circuit diagram illustrating an internal state of the load switch IC in response to a high-level application to a control terminal CE in a normal state (Vin Vout)
Figure 4B:
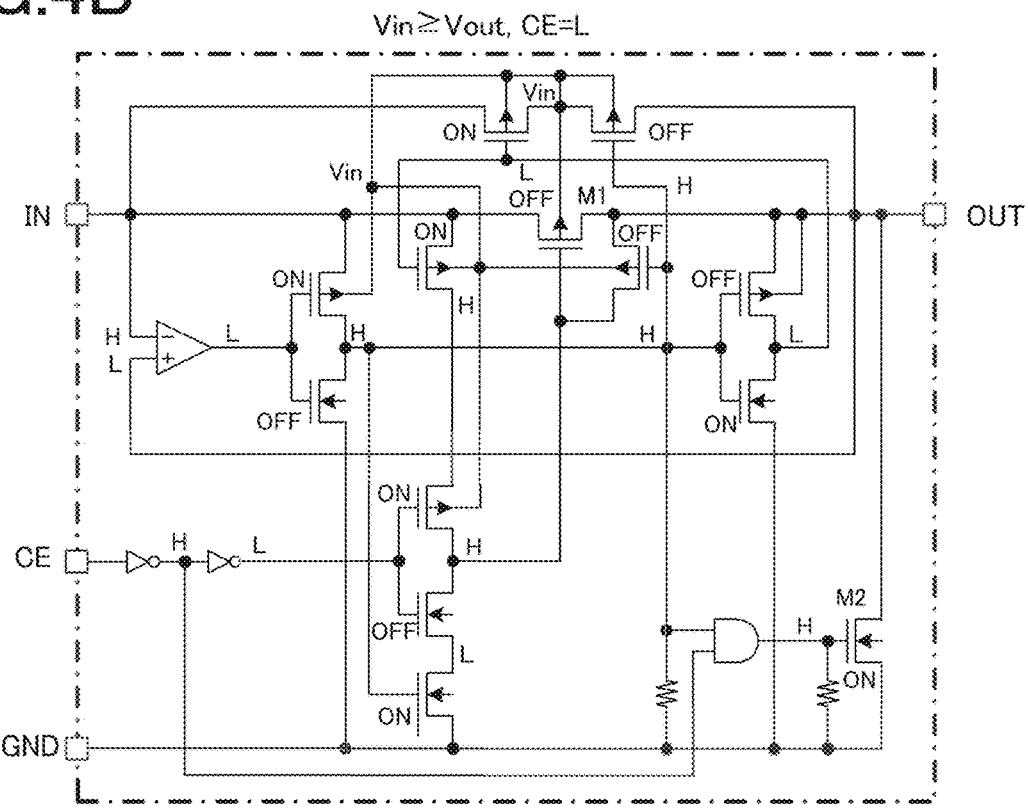
FIG. 4B is a circuit diagram illustrating an internal state of the load switch IC in response to a low-level application to the control terminal CE in the normal state.

FIG. 4A illustrates the on/off state of each transistor and the logic state (H or L) of each node in response to a high-level application to the control terminal CE in the normal state (Vin≥Vout), where the input voltage Vin is equal to or higher than the output voltage Vout. FIG. 4B illustrates the on/off state of each transistor and the logic state (H or L) of each node in response to a low-level application to the control terminal CE in the normal state (Vin≥Vout).

Figure 5A:
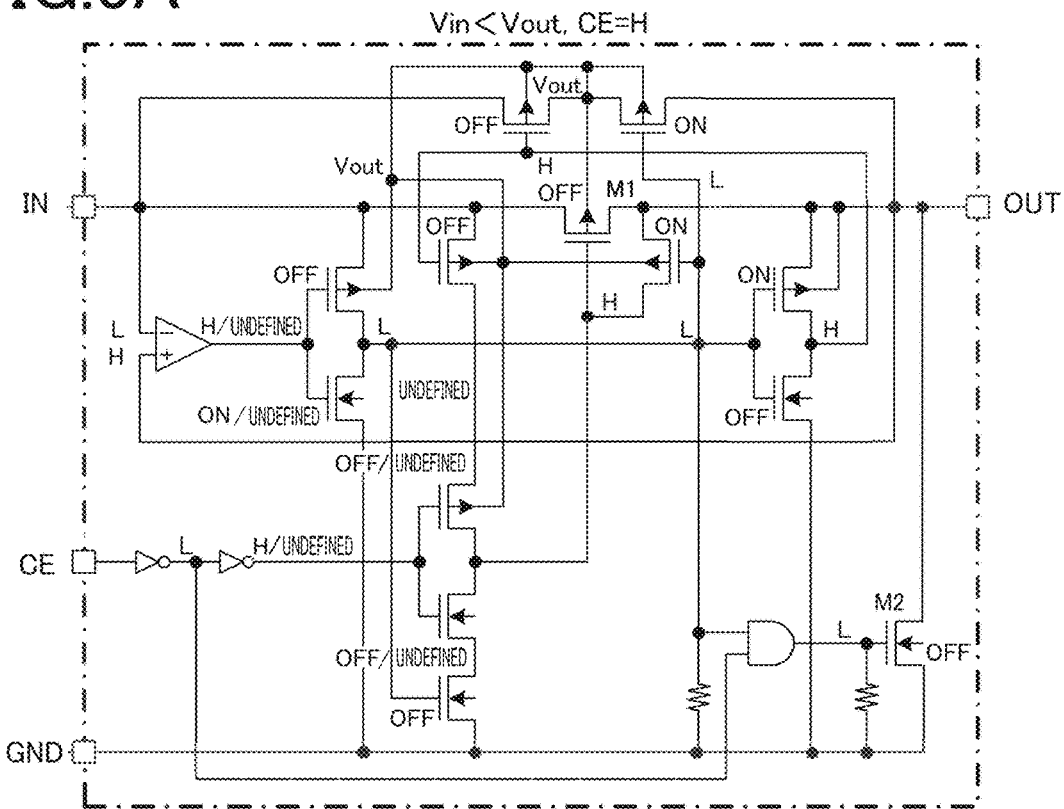
FIG. 5A is a circuit diagram illustrating an internal state of the load switch IC in response to a high-level application to the control terminal CE in an input-output reversed state (Vin<Vout)
Figure 5B:
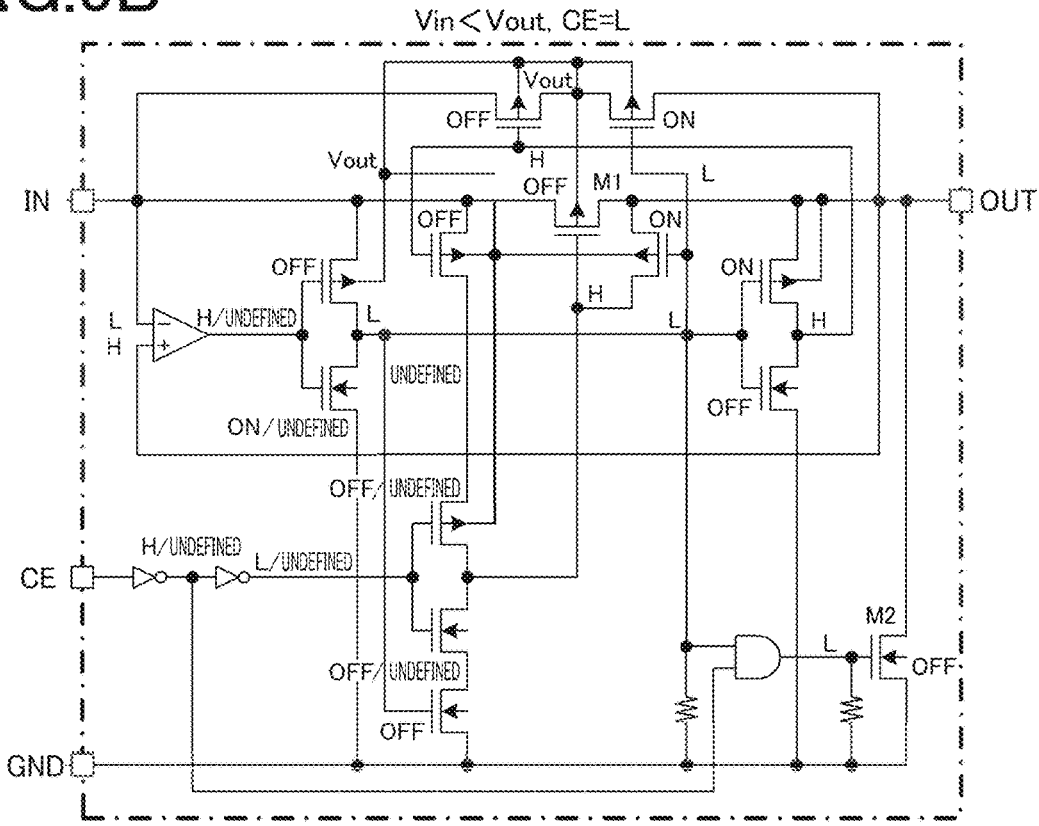
FIG. 5B is a circuit diagram illustrating an internal state of the load switch IC in response to a low-level application to the control terminal CE in the input-output reversed state (Vin<Vout)
Figure 6:
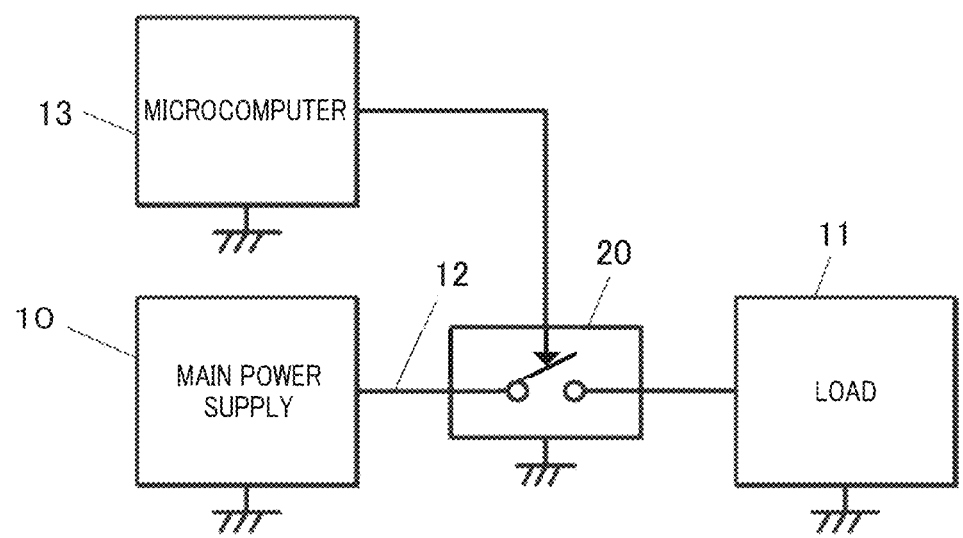
FIG. 6 is a system configuration diagram illustrating an example of a general configuration of a system using a conventional load switch IC.
Figure 7:
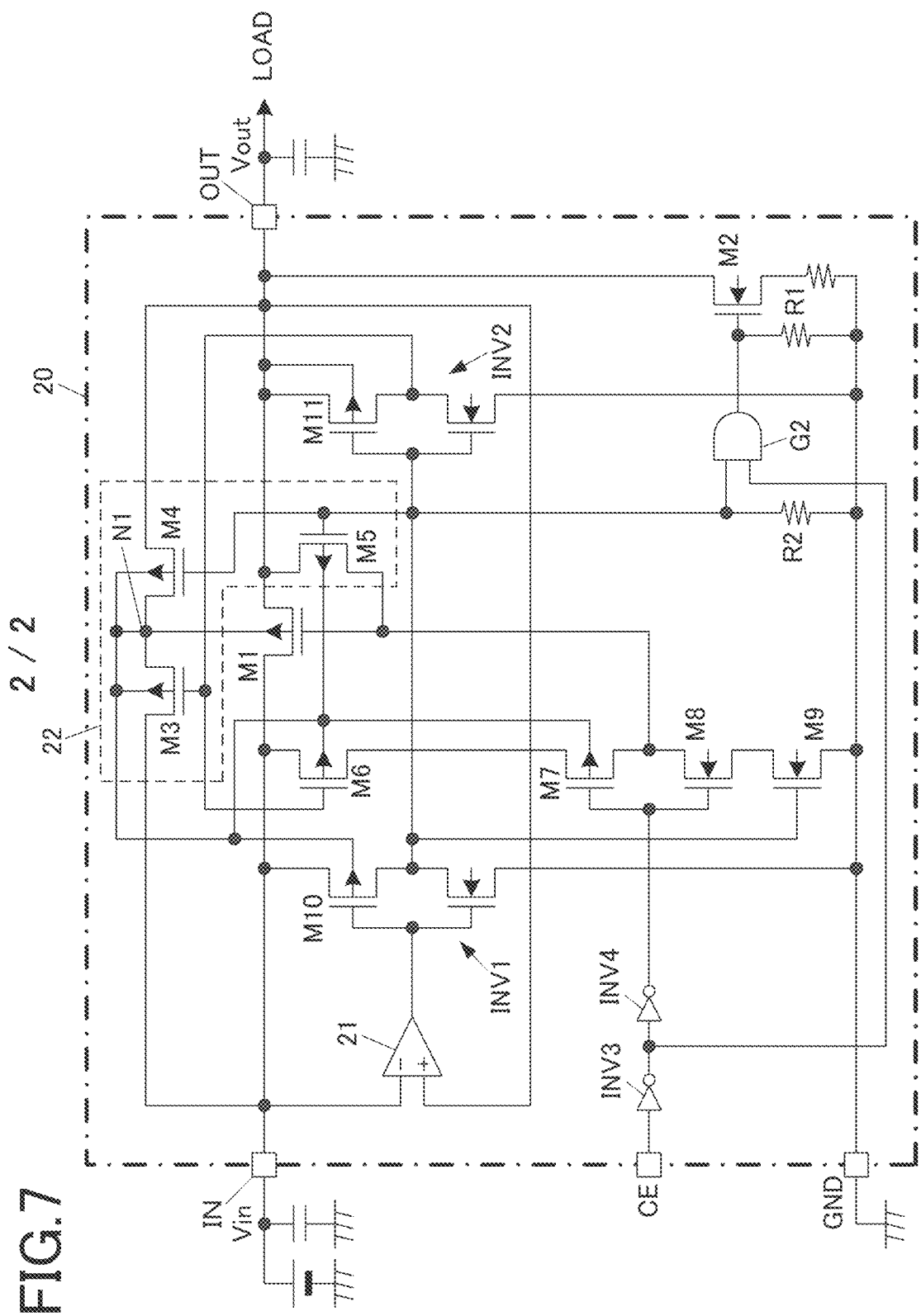

Meanwhile, FIG. 5A illustrates the on/off state of each transistor and the logic state (H or L) of each node in response to a high-level application to the control terminal CE in the input-output reversed state (Vin<Vout), where the input voltage Vin is lower than the output voltage Vout. FIG. 5B illustrates the on/off state of each transistor and the logic state (H or L) of each node in response to a low-level application to the control terminal CE in the input-output reversed state (Vin<Vout), where the input voltage Vin is lower than the output voltage Vout.

FIGS. 4A, 4B, 5A and 5B reveal that the electric potential of the back gate of the load switching transistor M1 is the input voltage Vin in the normal state, where the input voltage Vin is equal to or higher than the output voltage Vout. In the input-output reversed state, the electric potential of the back gate of the load switching transistor M1 is the output voltage Vout, which prevents unnecessary current flow into the parasitic element. In the input-output reversed state, the transistor M1 is turned off by the output of the comparator 21. This prevents reverse current flow from the output terminal OUT to the input terminal IN in the load switching transistor M1 in the input-output reversed state.

Furthermore, in the input-output reversed state, the discharging transistor M2 is turned off, which prevents the current flow from the output terminal OUT towards the ground point.

Modification

In the load switch IC 20 of the example illustrated in FIG. 3, only the discharging transistor M2 is provided between the output terminal OUT and the ground point. As an alternative, a resistor element can be connected in series to the discharging transistor M2 to limit the discharging current and to adjust the dropping time of the power supplied to the load. This allows a system with a plurality of loads and power supplies in which operations of the loads are stopped in a predetermined order, for example, to be safely stopped by dropping the power supply of each load in a predetermined order.

Although some embodiments of the present invention have been described and illustrated in detail, the disclosed embodiments are made for purposes of not limitation but illustration and example only. The scope of the present invention should be interpreted by terms of the appended claims. For example, the logic circuit 23 in the load switch IC 20 in the above embodiment is not limited to the configurations illustrated in FIGS. 2 and 3 but may be any configuration as long as the conditions of the truth table in Table 1 are satisfied.

The pull-down resistor is provided only at one input terminal of the AND gate G2 constituting the logic circuit 23 in the above embodiment but can be also provided at the other input terminal.

Furthermore, the present invention can be applied to a device known as a high-side switch or a FET switch, which have functions similar to the load switch IC.

The invention claimed is:

1. A semiconductor integrated circuit device, comprising:
a switching transistor that is connected between a voltage input terminal to which DC voltage is input and a voltage output terminal;
a discharging transistor that is connected between the voltage output terminal and a ground point;
an external terminal to which a control signal of an external device is input; and
a control circuit that controls and turns on or off the switching transistor and the discharging transistor based on the control signal,
wherein:
the control circuit includes:
a logic circuit;
a voltage comparison circuit that compares a voltage at the voltage input terminal and a voltage at the voltage output terminal; and
a back gate control circuit that prevents reverse current in the switching transistor,
upon the control signal that is input to the external terminal being at a first logic level, the logic circuit generates a signal that controls the switching transistor to be turned on and controls the discharging transistor to be turned off,
upon the control signal that is input to the external terminal being at a second logic level, the logic circuit generates a signal that controls the switching transistor to be turned off and controls the discharging transistor to be turned on, and
upon a voltage at the voltage input terminal being higher than a voltage at the voltage input terminal according to an output signal of the voltage comparison circuit, the logic circuit controls the back gate control circuit to prevent the reverse current and generates a signal that turns off the switching transistor and the discharging transistor regardless of a logic level of the control signal.

2. The semiconductor integrated circuit device according to claim 1, wherein:
the voltage comparison circuit and the logic circuit operate by taking a voltage at the voltage input terminal as a power supply voltage,
the discharging transistor is an N-channel type MOS transistor, and
a first pull-down resistor is provided between a gate terminal of the discharging transistor and the ground point.

3. The semiconductor integrated circuit device according to claim 2, wherein:
the logic circuit includes an AND gate to which a first signal corresponding to an output signal of the voltage comparison circuit and a second signal corresponding to the control signal are input and that outputs a signal that is to be applied to a control terminal of the discharging transistor, and
a second pull-down resistor is provided between the ground point and at least one input terminal of the AND gate.

4. The semiconductor integrated circuit device according to claim 1, further comprising:
a resistor element that is connected in series to the discharging transistor.

* * * * *